(12) United States Patent
Abulikemu et al.

(10) Patent No.: US 8,916,457 B2
(45) Date of Patent: Dec. 23, 2014

(54) IN SITU SYNTHESIS OF NANOPARTICLES ON SUBSTRATES BY INKJET PRINTING

(71) Applicant: King Abdullah University of Science and Technology, Thuwal (SA)

(72) Inventors: Mutalifu Abulikemu, Thuwal (SA); Ghassan Jabbour, Thuwal (SA)

(73) Assignee: King Abdullah University of Science and Technology, Thuwal (SA)

( * ) Notice: Subject to any disclaimer, the term of this patent is extended or adjusted under 35 U.S.C. 154(b) by 0 days.

(21) Appl. No.: 13/900,386

(22) Filed: May 22, 2013

(65) Prior Publication Data

US 2013/0316482 A1    Nov. 28, 2013

Related U.S. Application Data

(60) Provisional application No. 61/650,375, filed on May 22, 2012.

(51) Int. Cl.
| | |
|---|---|
| *H01L 21/02* | (2006.01) |
| *H01L 33/00* | (2010.01) |
| *H01L 31/18* | (2006.01) |
| *H01L 33/06* | (2010.01) |
| *H01L 33/16* | (2010.01) |
| *H01L 33/28* | (2010.01) |

(52) U.S. Cl.
CPC ........ *H01L 21/02628* (2013.01); *H01L 33/005* (2013.01); *H01L 31/18* (2013.01); *H01L 21/0237* (2013.01); *H01L 21/02543* (2013.01); *H01L 21/02568* (2013.01); *H01L 21/02601* (2013.01); *H01L 33/06* (2013.01); *H01L 33/16* (2013.01); *H01L 33/28* (2013.01); *Y10S 977/892* (2013.01)
USPC ............................ 438/502; 438/686; 977/892

(58) Field of Classification Search
USPC ......................................................... 438/502
See application file for complete search history.

(56) References Cited

U.S. PATENT DOCUMENTS

| | | | |
|---|---|---|---|
| 5,401,535 A | 3/1995 | Bishop | |
| 5,743,946 A | 4/1998 | Aoki et al. | |
| 6,616,741 B1 | 9/2003 | Sawa et al. | |
| 7,211,135 B2 | 5/2007 | Berkei et al. | |
| 8,048,488 B2 * | 11/2011 | Li et al. | 427/383.1 |
| 2008/0296567 A1 * | 12/2008 | Irving et al. | 257/43 |

FOREIGN PATENT DOCUMENTS

WO   WO 2010/085553 A1 *   7/2010   ................ C03B 1/00

* cited by examiner

*Primary Examiner* — Stephen W Smoot
(74) *Attorney, Agent, or Firm* — Fulbright & Jaworski LLP

(57) ABSTRACT

Nanoparticles may be formed on a substrate by mixing precursor solutions deposited by an inkjet printer. A first solution is deposited on a substrate from a first inkjet print cartridge. Then, a second solution is deposited on the substrate from a second inkjet print cartridge. The solutions may be printed in an array of droplets on the substrate. Nanoparticles form when droplets of the first solution overlap with droplets of the second solution. In one example, the nanoparticles may be gold nanoparticles formed from mixing a first solution of 1,2-dichlorobenzene (DCB) and oleylamine and a second solution of gold chloride trihydrite and dimethyl sulfoxide (DMSO). The nanoparticles may be incorporated into optoelectronic devices.

34 Claims, 3 Drawing Sheets

IN SITU SYNTHESIS OF NANOPARTICLES ON SUBSTRATES BY INKJET PRINTING

CROSS-REFERENCE TO RELATED APPLICATIONS

This application claims the benefit of priority of U.S. Provisional Patent Application No. 61/650,375 to Mutalifu Abulikemu and Ghassan Jabbour filed on May 22, 2012 and entitled "In Situ Synthesis of Nanoparticles on Substrates by Inkjet Printing," which is hereby incorporated by reference in its entirety.

FIELD OF THE DISCLOSURE

This invention relates to printing and more particularly relates to in-situ ink jet synthesis of nano particles.

BACKGROUND

Nanoparticles, and particularly gold nanoparticles, have unique physical and chemical properties. These properties have increased interest in improving nanoparticles synthesis and creating commercially-feasible processes. Conventionally, nanoparticles are deposited using physical vapor deposition (PVD) methods, such as co-evaporation and co-sputtering.

These processes are complex and result in low yield of nanoparticles with the desired composition, size, and size distribution. Further, operation of PVD processes is expensive and generates relatively low throughput. In particular, PVD processes operate in vacuum environments. Loading substrates into chambers and evacuating air from the chamber to lower the pressure into the operational range for the PVD process requires time, which reduces throughput. Further, the deposition process is relatively uncontrolled and may result in wasted materials. For example, in a co-sputtering process, the materials are deposited across an area much wider than just the substrate. Thus, if the materials are expensive, such as when gold nanoparticles are deposited, the wasted material may represent a large expense.

One conventional solution for improving nanoparticles deposition processes is printing the nanoparticles with an inkjet printer or other printer. An advantage of inkjet printing is the lack of requirement for a vacuum environment. The conventional process involves preparing a stable ink solution of nanoparticles in a solvent through wet chemical synthesis. The stable solution is then printed on a substrate with the inkjet printer. However, this process has several disadvantages. For example, the preparation of the stable ink solution is difficult and requires significant preparation time and purification before printing the ink with the inkjet printer. Moreover, infiltration of a porous medium is limited to the size of the nanoparticles used.

BRIEF SUMMARY

Nanoparticles may be synthesized with inkjet printing, or other type of printing, through a two-step process for depositing solution on a substrate. A first step involves depositing a first solution, and the second step involves depositing a second solution, in which the first and second solutions are precursors to nanoparticles. Nanoparticles may be formed through a chemical reaction, which occurs when the second solution mixes with the first solution. Methods for depositing nanoparticles from precursor solutions offer a number of advantages, including the versatility to print nanoparticles of different materials or sizes based on the selected first and second solutions, reduced cost by fully utilizing the first and second solutions, and improves control over the deposition pattern because nanoparticles only form where the first and second solutions mix.

According to one embodiment, a method includes depositing a first chemical solution on a substrate with a first inkjet cartridge. The method also includes depositing a second chemical solution on the substrate with a second inkjet cartridge to mix with the first chemical solution and form nanoparticles on the substrate.

In some embodiments, the method may also include heating the substrate after deposing the second chemical solution, selecting a temperature for heating the substrate based on a desired size of the nanoparticles, cleaning the substrate before depositing the first chemical solution, filling the first ink jet cartridge with the first chemical solution before depositing the first chemical solution, filling the second ink jet cartridge with the second chemical solution before depositing the second chemical solution, and/or integrating the nanoparticles into an opto-electronic device.

In certain embodiments, the method may include depositing a first solution comprising one of a solvated alkyl amine and a solvated alkene amine and/or depositing a second solution comprising a metal halide. In particular, certain embodiments may include depositing a first solution comprising a solution of 1,2 dichlorobenzene (DCB) and oleylamine and/or depositing a second solution of one of gold chloride trihydrite, gold chloride hydrite, and gold chloride.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
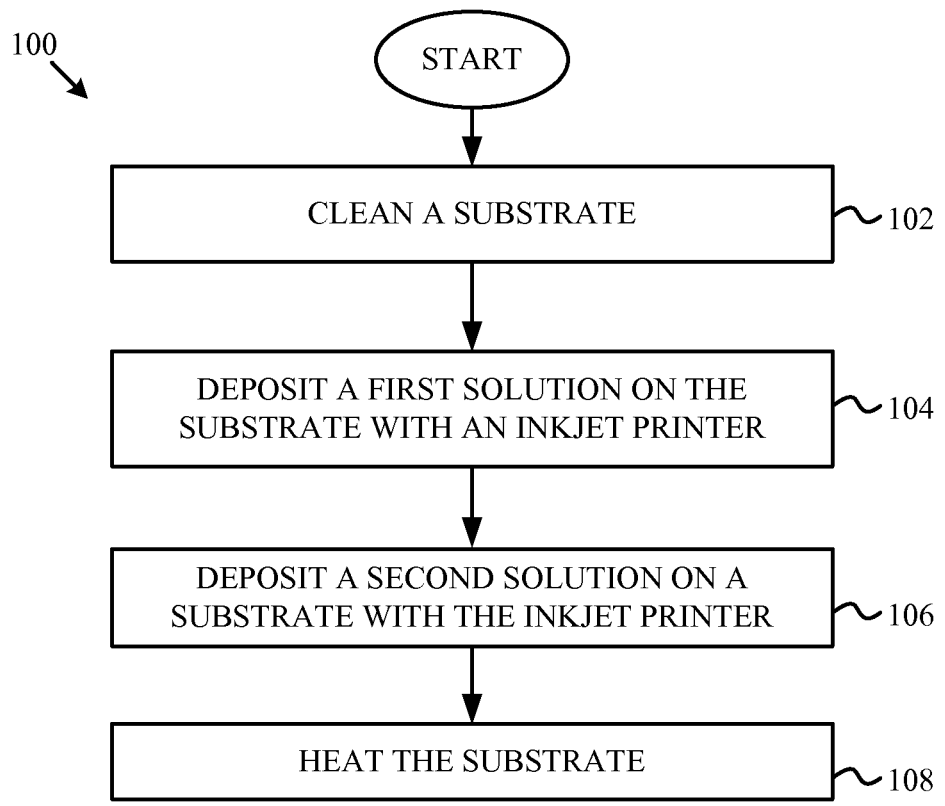
FIG. 1 is a flow chart illustrating a method for depositing nanoparticles on a substrate with inkjet printing according to one embodiment of the disclosure.

FIG. 1 is a flow chart illustrating a method 100 for depositing nanoparticles on a substrate with inkjet printing according to one embodiment of the disclosure. Method 100 begins at block 102 with cleaning a substrate. The substrate may be one of rigid or flexible substrates, such as silicon, glass, indium tin oxide (ITO), metal, textile, paper, and polyimide. The substrate may also be a combination of these materials and/or similar materials, such as a substrate having a silicon oxide layer deposited on a silicon base. Cleaning the substrate may include one or more of rinsing the substrate with water, drying the substrate, rinsing with substrate in ethanol with ultrasonic agitation, rinsing the substrate in acetone with ultrasonic agitation, rinsing the substrate in isopropanol alcohol with ultrasonic agitation, and drying the substrate.

At block 104, a first solution is deposited on the substrate with an inkjet printer. The inkjet printer may be a piezoelectric drop-on-demand printer. The first solution may be one of a solvated alkyl amine and a solvated alkene amine. For example, the first solution may be a solution of 1,2-dichlorobenzene (DCB) solvent and oleylamine. When the nanoparticles deposited with the method 100 are gold nanoparticles, the first solution may be mixed with a ratio of 1 mL oleylamine to 10 mL of DCB solvent. According to one embodiment, the size of the gold nanoparticles may be controlled by adjusting the ratio of oleylamine to DCB solvent. After the first solution is prepared, the first solution may be filtered, such as through a 0.45 micrometer filter. The first solution may be loaded into a first inkjet cartridge, and the first inkjet cartridge may then be loaded into a printer and controlled to deposit an array of droplets on the cleaned substrate of block 102.

Figure 2:
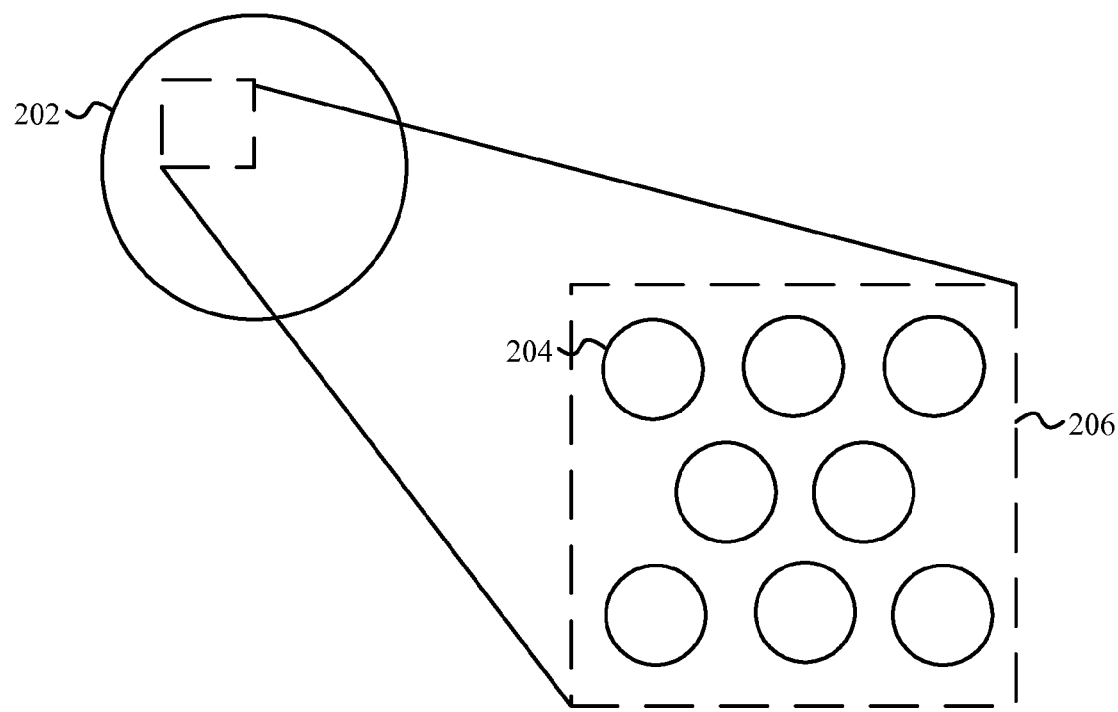
FIG. 2 is a block diagram illustrating a deposited array of the first solution according to one embodiment of the disclosure.

FIG. 2 is a block diagram illustrating a deposited array of the first solution according to one embodiment of the disclosure. A substrate 202 may have droplets 204 deposited in at least a portion 206 of the substrate 202. The droplets 204 may be 10 micrometers in diameter and separated by 20-100 micrometer spacing.

At block 106, a second solution is deposited on the substrate with the inkjet printer. The second solution may include a metal halide. For example, the second solution may be a solution of dimethyl sulfoxide (DMSO) and a group XI metal halide. When the nanoparticles deposited with the method 100 are gold nanoparticles, the second solution may be one of gold chloride trihydrite, gold chloride hydrite, and gold chloride dissolved in DMSO. Nanoparticles having other metals may be deposited with the method 100, such as silver, lead, or indium. Additionally, semiconductor-based nanoparticles may be deposited with the method 100, including binary and trinary semiconductors. After the second solution is prepared, the second solution may be loaded into a second inkjet cartridge. According to one embodiment, the second inkjet cartridge may be a different cartridge than the first cartridge. The second inkjet cartridge may then be loaded into a printer and controlled to deposit an array of droplets on the cleaned substrate of block 102. The droplet array deposited at block 106 may overlap the droplet array deposited at block 104. When the first solution and the second solution interact, nanoparticles may be formed in the mixed solution.

At block 108, the substrate is heated to evaporate the solvent and leave the nanoparticles on the substrate. The substrate may be heated in an oven at a temperature between approximately 55 degrees Celsius and approximately 140 degrees Celsius for between 30 minutes and 24 hours. According to one embodiment, the temperature and time may be adjusted to control the size and size distribution of the nanoparticles. For example, shorter heating times may result in smaller nanoparticles with a larger size distribution. A 10 nm diameter for nanoparticles may be created by heating the substrate at 120 degrees Celsius for three hours.

Figure 3:
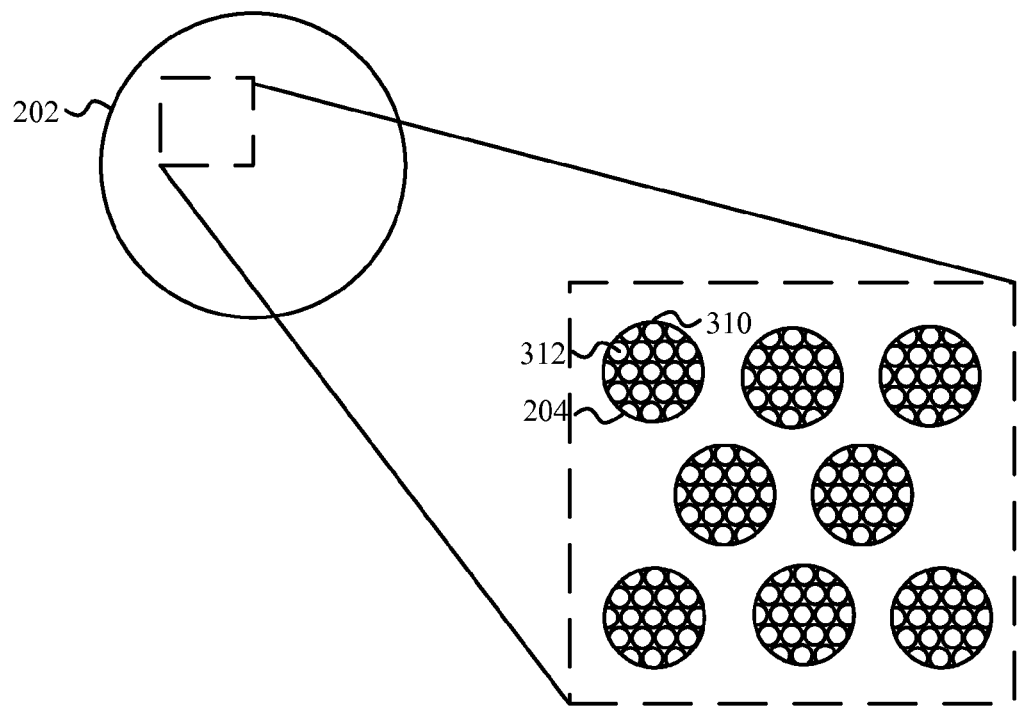
FIG. 3 is a block diagram illustrating the nanoparticles formed on the surface of a substrate after inkjet printing according to one embodiment of the disclosure.

The nanoparticles may form a random matrix or a self-assembled matrix of nanoparticles in the overlapped regions of first solution and second solution. FIG. 3 is a block diagram illustrating the nanoparticles formed on the surface of a substrate after inkjet printing according to one embodiment of the disclosure. Nanoparticles 312 may self-assemble into a grid 310 on the substrate 202 of nearly equal spacing within the droplets 204 produced by the inkjet printer. The arrangement of the nanoparticles 312 in the grid 310 may be adjusted by altering the first solution and the second solution in blocks 104 and 106. The self-assembly may also be ordered by a pre-patterned grid on the substrate 202. According to one embodiment, the nanoparticles 312 may be randomly dispersed within the grid 310. According to another embodiment, the grid 310 may extend through the entire surface area of substrate 200 without breaks.

The schematic flow chart diagram of FIG. 1 is generally set forth as logical flow chart diagrams. As such, the depicted order and labeled steps are indicative of one embodiment of the presented method. For example, the second solution of block 106 may be printed before the first solution of block 104. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 4:
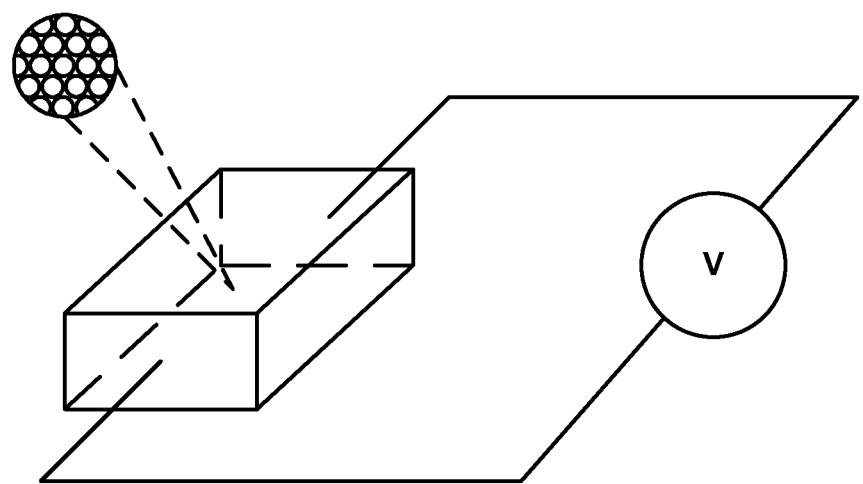
FIG. 4 is a graphic illustration of a light emitting diode (LED) incorporating the nanoparticles deposited by an inkjet printer according to one embodiment of the disclosure.

Nanoparticles deposited according to the method of FIG. 1 and/or in the arrangements of FIGS. 2 and 3, may be implemented in optoelectronic devices. For example, indium phosphate (InP) nanoparticles may be deposited on a substrate, followed by formation of supporting electrical circuits to excite the nanoparticles into fluorescing. Thus, the nanoparticles may be formed as light emitting diodes (LEDs) in a lighting source. The lighting source may then be employed in overhead lighting in buildings and residences or employed in indicator lights for electronic devices. FIG. 4 is a graphic illustration of a light emitting diode (LED) incorporating the nanoparticles deposited by an inkjet printer according to one embodiment of the disclosure. Other optoelectronic uses for nanoparticles may include solar cells. For example, lead sulfite (PbS) nanoparticles may be deposited as a component of an electrode in a solar cell. Other examples include PbSe, CdS, CdSe, and $CuInS_2$. The nanoparticles may also be implemented in other devices, such as fuel cells and solar cells.

Figure 5:
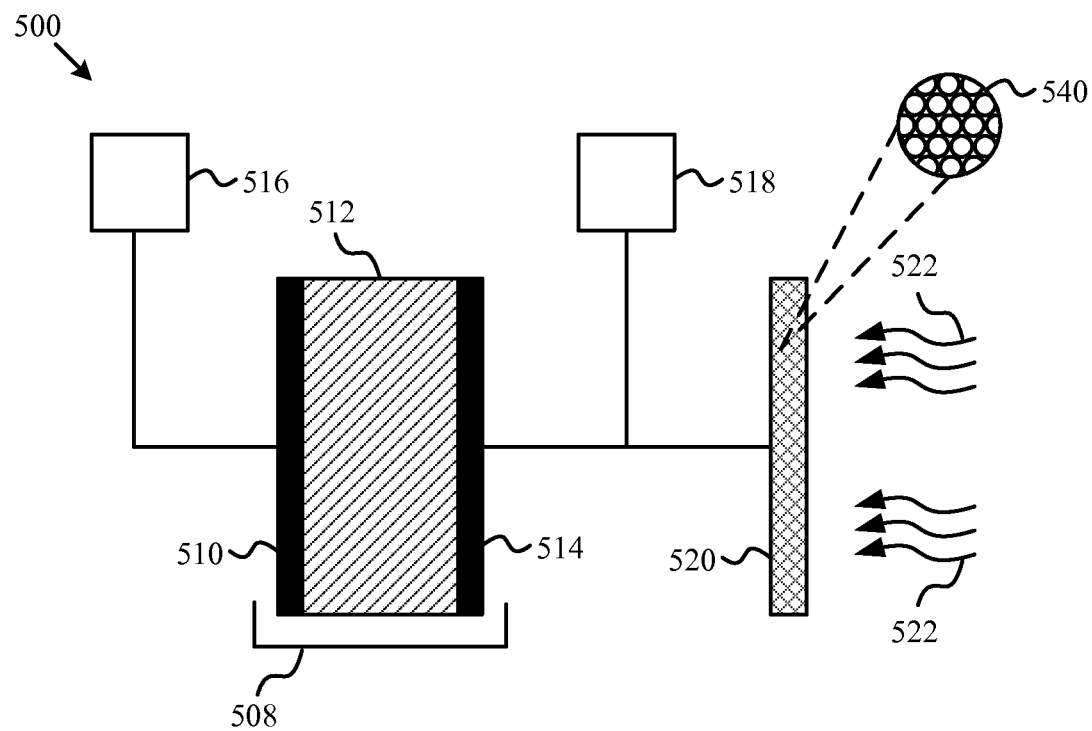
FIG. 5 is a graphic illustration of a solar cell incorporating nanoparticles deposited by an inkjet printer according to one embodiment of the disclosure.

FIG. 5 is a graphic illustration of a solar cell incorporating the nanoparticles deposited by an inkjet printer according to one embodiment of the disclosure. An apparatus 500 includes a solar cell 520 and an energy storage device 508, such as a battery or capacitor. The solar cell 520 may include one or more layers of nanoparticles 540 deposited by an in-situ synthesis method, such as by inkjet printing as described above. According to one embodiment, the energy storage device 508 may be a parallel-plate capacitor, such as a super capacitor, having a first electrode 510 and a second electrode 514 separated by an insulator 512. Contact pads 516 and 518 may be coupled to the electrodes 510 and 514, respectively.

The solar cell 520 converts light 522 into an electrical voltage. The voltage generated by the solar cell 520 may charge the energy storage device 508, which is integrated with the solar cell 520. The energy stored in the energy storage device 508 may be accessed by an electronic device through the contact pads 516 and 518. For example, the contact pads 516 and 518 may be coupled to a personal data assistant (PDA), a tablet computer, a laptop, a smartphone, a cellular phone, a portable game console, and/or a game console accessory.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
   depositing a first chemical solution on a substrate with a first inkjet cartridge, wherein the first chemical solution comprises a solution of 1,2-dichlorobenzene (DCB) and oleylamine; and
   depositing a second chemical solution on the substrate with a second inkjet cartridge to mix with the first chemical solution and to form nanoparticles on the substrate.

2. The method of claim 1, further comprising heating the substrate after depositing the second chemical solution.

3. The method of claim 2, the step of heating the substrate comprising evaporating solvents of the first chemical solution and the second chemical solution.

4. The method of claim 2, the step of heating the substrate comprising heating the substrate at temperatures between 55 degrees Celsius and 140 degrees Celsius.

5. The method of claim 4, further comprising selecting a temperature for heating the substrate based on a desired size of the nanoparticles.

6. The method of claim 1, the second chemical solution comprising a metal halide.

7. The method of claim 6, the second chemical solution comprising a solution of dimethyl sulfoxide (DMSO) and at least one of gold chloride trihydrite, gold chloride hydrite, and gold chloride.

8. The method of claim 1, the step of depositing a first chemical solution on a substrate comprising depositing the first chemical solution on at least one of silicon, glass, indium tin oxide (ITO), and polyimide.

9. The method of claim 1, further comprising cleaning the substrate before depositing the first chemical solution.

10. The method of claim 1, the second chemical solution comprising a solution of gold chloride trihydrite and dimethyl sulfoxide, and the nanoparticles are gold nanoparticles.

11. The method of claim 10, the first inkjet cartridge comprising a different cartridge than the second inkjet cartridge.

12. The method of claim 11, further comprising:
    filling the first ink jet cartridge with the first chemical solution before depositing the first chemical solution; and
    filling the second ink jet cartridge with the second chemical solution before depositing the second chemical solution.

13. The method of claim 1, further comprising integrating the nanoparticles into an optoelectronic device.

14. The method of claim 13, the optoelectronic device comprising a light emitting diode (LED).

15. The method of claim 1, further comprising integrating the nanoparticles into a plasmonic solar cell.

16. The method of claim 1, in which the step of depositing the second chemical solution forms nanoparticles comprising at least one of a binary semiconductor and a ternary semiconductor.

17. The method of claim 16, in which the nanoparticles comprise at least one of PbS, PbSe, CdS, CdSe, InP, and $CuInS_2$.

18. A method, comprising:
    depositing a first chemical solution on a substrate with a first inkjet cartridge; and
    depositing a second chemical solution on the substrate with a second inkjet cartridge to mix with the first chemical solution and to form nanoparticles on the substrate, wherein the second chemical solution comprises a solution of dimethyl sulfoxide (DMSO) and at least one of gold chloride trihydrite, gold chloride hydrite, and gold chloride.

19. The method of claim 18, further comprising heating the substrate after depositing the second chemical solution.

20. The method of claim 19, the step of heating the substrate comprising evaporating solvents of the first chemical solution and the second chemical solution.

21. The method of claim 20, the step of heating the substrate comprising heating the substrate at temperatures between 55 degrees Celsius and 140 degrees Celsius.

22. The method of claim 21, further comprising selecting a temperature for heating the substrate based on a desired size of the nanoparticles.

23. The method of claim 18, the first chemical solution comprising at least one of a solvated alkyl amine and a solvated alkene amine.

24. The method of claim 23, the first chemical solution comprising a solution of 1,2-dichlorobenze (DCB) and oleylamine.

25. The method of claim 18, the step of depositing a first chemical solution on a substrate comprising depositing the first chemical solution on at least one of silicon, glass, indium tin oxide (ITO), and polyimide.

26. The method of claim 18, further comprising cleaning the substrate before depositing the first chemical solution.

27. The method of claim 18, the first chemical solution comprising a solution of 1,2-dichlorobenzene and oleylamine, the second chemical solution comprising a solution of gold chloride trihydrite and dimethyl sulfoxide, and the nanoparticles are gold nanoparticles.

28. The method of claim 27, the first inkjet cartridge comprising a different cartridge than the second inkjet cartridge.

29. The method of claim 28, further comprising:
    filling the first ink jet cartridge with the first chemical solution before depositing the first chemical solution; and
    filling the second ink jet cartridge with the second chemical solution before depositing the second chemical solution.

30. The method of claim 18, further comprising integrating the nanoparticles into an optoelectronic device.

31. The method of claim 30, the optoelectronic device comprising a light emitting diode (LED).

32. The method of claim 18, further comprising integrating the nanoparticles into a plasmonic solar cell.

33. The method of claim 18, in which the step of depositing the second chemical solution forms nanoparticles comprising at least one of a binary semiconductor and a ternary semiconductor.

34. The method of claim 33, in which the nanoparticles comprise at least one of PbS, PbSe, CdS, CdSe, InP, and CuInS2.

* * * * *